US010670906B2

(12) United States Patent
Lin et al.

(10) Patent No.: US 10,670,906 B2
(45) Date of Patent: Jun. 2, 2020

(54) DISPLAY PANEL HAVING FIRST, SECOND, AND THIRD ELECTRODES

(71) Applicant: Au Optronics Corporation, Hsinchu (TW)

(72) Inventors: Sih-Yan Lin, Taipei (TW); Yao-An Hsieh, New Taipei (TW); Hsin-Chun Huang, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/181,344

(22) Filed: Nov. 6, 2018

(65) Prior Publication Data

US 2020/0004080 A1 Jan. 2, 2020

(30) Foreign Application Priority Data

Jun. 29, 2018 (TW) .............................. 107122649 A (51) Int. Cl.
| | |
|---|---|
| *G02F 1/1335* | (2006.01) |
| *H01L 27/12* | (2006.01) |
| *G02F 1/1368* | (2006.01) |
| *G02F 1/1362* | (2006.01) |
| *G02F 1/1343* | (2006.01) |

(52) U.S. Cl.
CPC ...... *G02F 1/133512* (2013.01); *G02F 1/1368* (2013.01); *G02F 1/13624* (2013.01); *G02F 1/133514* (2013.01); *G02F 1/134309* (2013.01); *G02F 1/134363* (2013.01); *G02F 1/136227* (2013.01); *G02F 1/136286* (2013.01); *H01L 27/124* (2013.01); *G02F 1/136209* (2013.01); *G02F 2001/13685* (2013.01); *G02F 2001/134372* (2013.01); *G02F 2001/136222* (2013.01)

(58) Field of Classification Search
CPC combination set(s) only.
See application file for complete search history.

(56) References Cited

U.S. PATENT DOCUMENTS

| 8,823,890 B2 | 9/2014 | Sekine |
| 9,341,880 B2 | 5/2016 | Wang et al. |

(Continued)

*Primary Examiner* — Lauren Nguyen
(74) *Attorney, Agent, or Firm* — JCIPRNET (57) ABSTRACT

A display panel including a scan line, a first data line, a second data line, a first switching element, a second switching element, a first electrode, two second electrodes, a third electrode, a black matrix and a plurality of color filter layers is provided. The first switching element is electrically connected with the scan line and the first data line. The second switching element is electrically connected with the second data line. The first electrode includes at least two first openings. The two second electrodes are electrically connected with the first switching element and the second switching element respectively through the at least two first openings. The third electrode includes two first body portions, a second body portion and at least two branch portions. The black matrix includes a plurality of second openings. Two neighboring color filter layers are disposed corresponding to one of the second openings and form an overlapped structure. The overlapped structure substantially covers at least a portion of the second data line.

17 Claims, 6 Drawing Sheets

(56) References Cited

U.S. PATENT DOCUMENTS

2012/0162578 A1* 6/2012 Kim .................. G02F 1/1391
    349/96
2012/0280240 A1* 11/2012 Sasaki ................ H01L 27/1214
    257/59

* cited by examiner

DISPLAY PANEL HAVING FIRST, SECOND, AND THIRD ELECTRODES

CROSS REFERENCE TO RELATED APPLICATION

This application claims the priority benefit of Taiwan application serial no. 107122649, filed on Jun. 29, 2018. The entirety of the above-mentioned patent application is hereby incorporated by reference herein and made a part of specification.

BACKGROUND

Technical Field

The invention relates to a display panel. More particularly, the invention relates to a display panel including a black matrix.

Description of Related Art

A black matrix in a display panel generally includes a plurality of openings corresponding to a plurality of pixel regions, so as to accommodate color filter layers. Nevertheless, the openings of the black matrix are subject to limitation of a minimum size owing to process limitation. As such, size of pixels cannot be further reduced, and development of high resolution of the display panels is thus affected.

SUMMARY

At least one embodiment of the invention provides a display panel capable of reducing size of pixels.

In at least one embodiment of the invention, a display panel includes a scan line, a first data line, a second data line, a first switching element, a second switching element, a first electrode, two second electrodes, a third electrode, a black matrix, and a plurality of color filter layers. The first data line and the second data line substantially extend in a first direction. The scan line substantially extends in a second direction. The first switching element is electrically connected to the scan line and the first data line. The second switching element is electrically connected to the second data line. The first electrode includes at least two first openings. The two second electrodes are electrically connected to the first switching element and the second switching element respectively through the at least two first openings. The third electrode includes two first body portions, a second body portion, and at least two branch portions. The two first body portions substantially extend in the first direction. The second body portion is located between the two first body portions and substantially extends in the first direction. The at least two branch portions are respectively connected to one of the two first body portions and the second body portion. The black matrix includes a plurality of second openings. The black matrix substantially shields at least a portion of the first data line. Two neighboring color filter layers are disposed corresponding to one of the plurality of second openings and form an overlapped structure. The overlapped structure substantially shields at least a portion of the second data line in the second opening.

To sum up, in the at least one embodiment of the invention, two color filter layers are designed to be disposed in one second opening of the black matrix, and a portion of the second data line which is not covered by the black matrix is shielded by both of the overlapped structure and the second body portion of the third electrode, and thereby, size of pixels is reduced and a light leakage is prevented.

To make the aforementioned characteristics and advantages more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The invention will be described more comprehensively below with reference to the drawings for the embodiments. However, the invention may also be implemented in different forms rather than being limited by the embodiments described in the invention. Thicknesses of layers and regions in the drawings are enlarged for clarity. The same reference numbers are used in the drawings and the description to indicate the same or like parts, which are not repeated in the following embodiments. Further, the language used to describe the directions such as up, down, left, right, front, back or the like in the reference drawings is regarded in an illustrative rather than in a restrictive sense. As such, the directional terminology is used for purposes of illustration and is in no way limiting.

Figure 1:
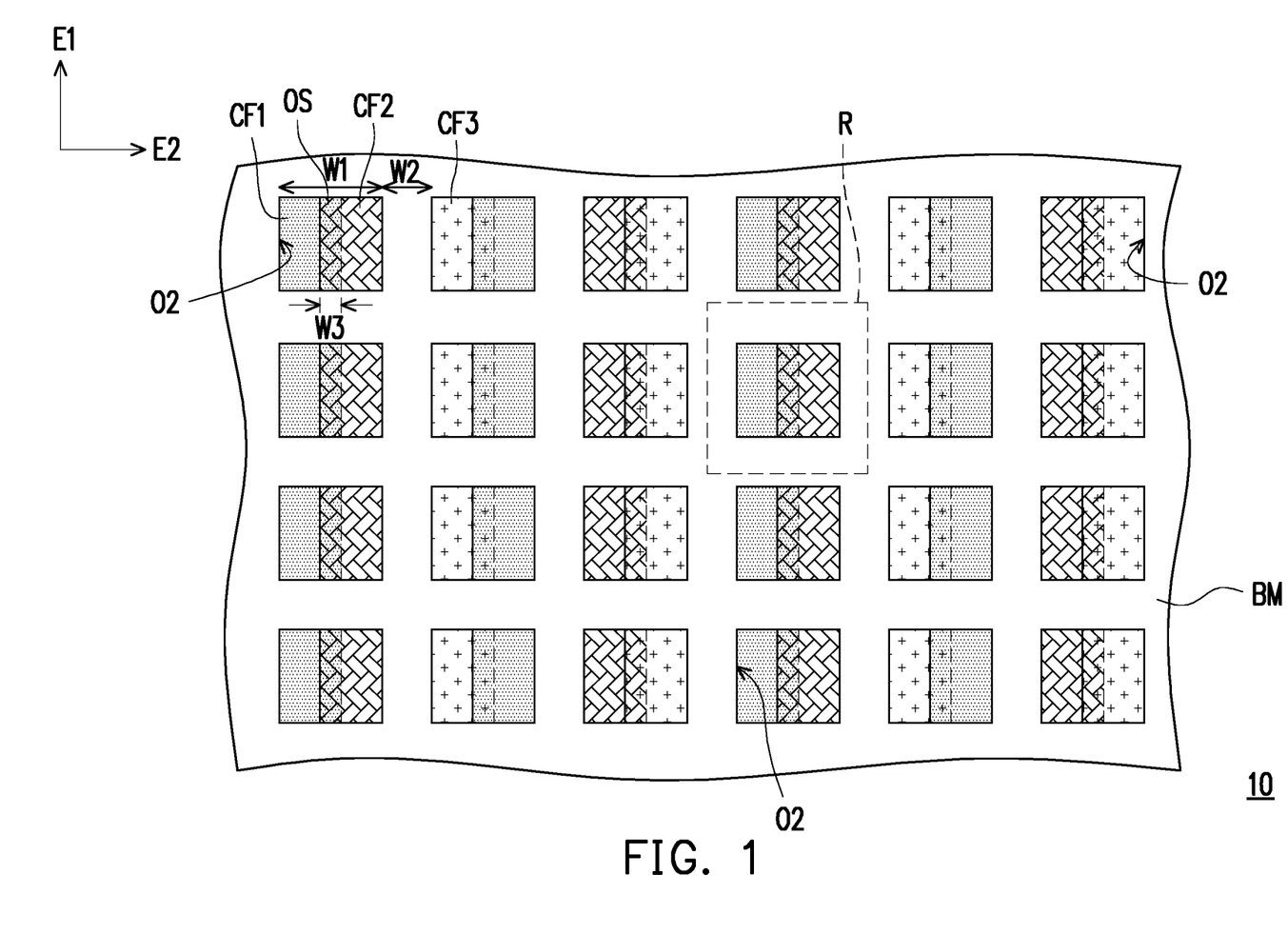
FIG. 1 is a schematic top view of a display panel according to an embodiment of the invention.
Figure 2A:
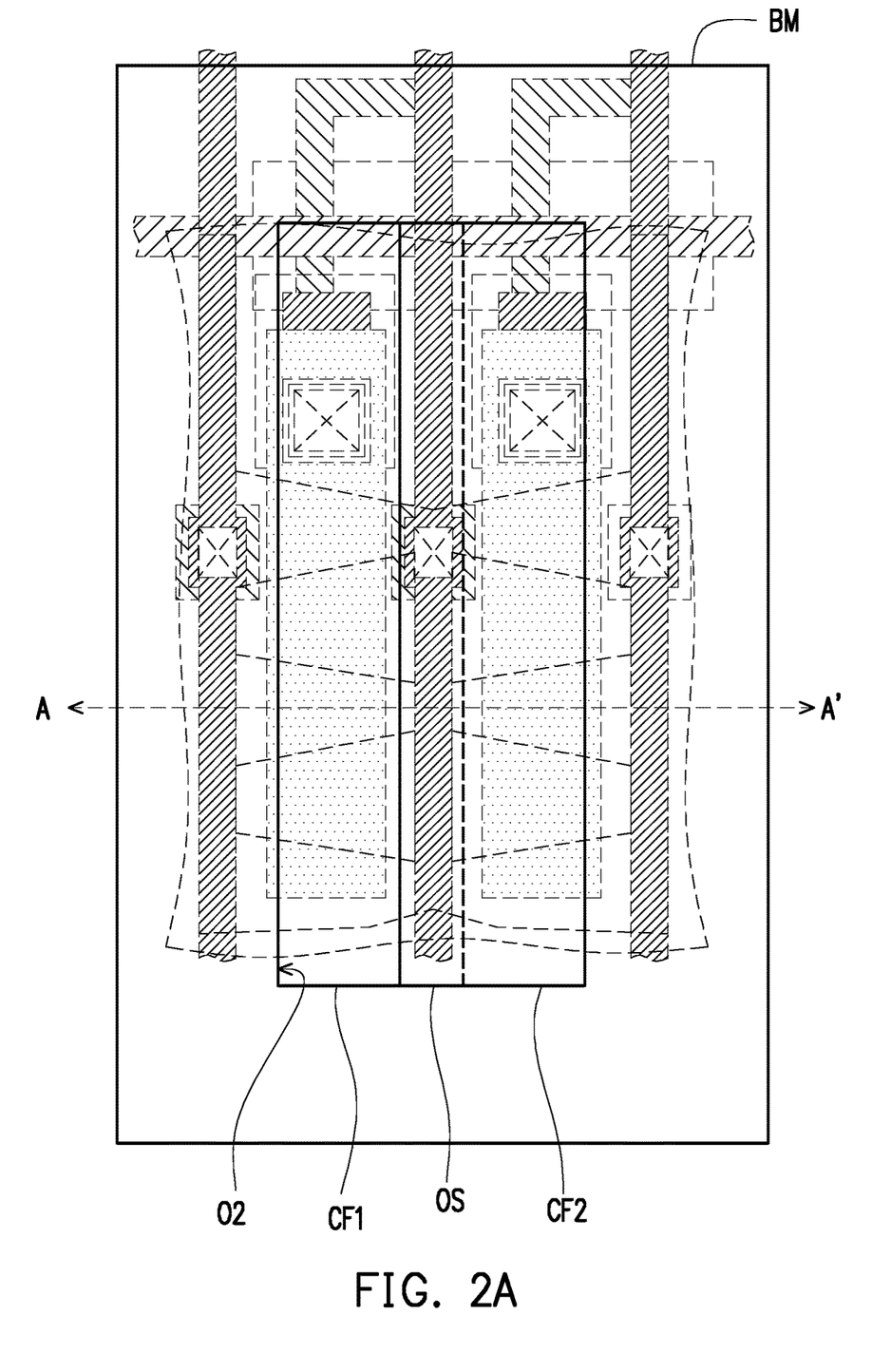
FIG. 2A is an enlarged view of a region R of the display panel in FIG. 1.
Figure 2B:
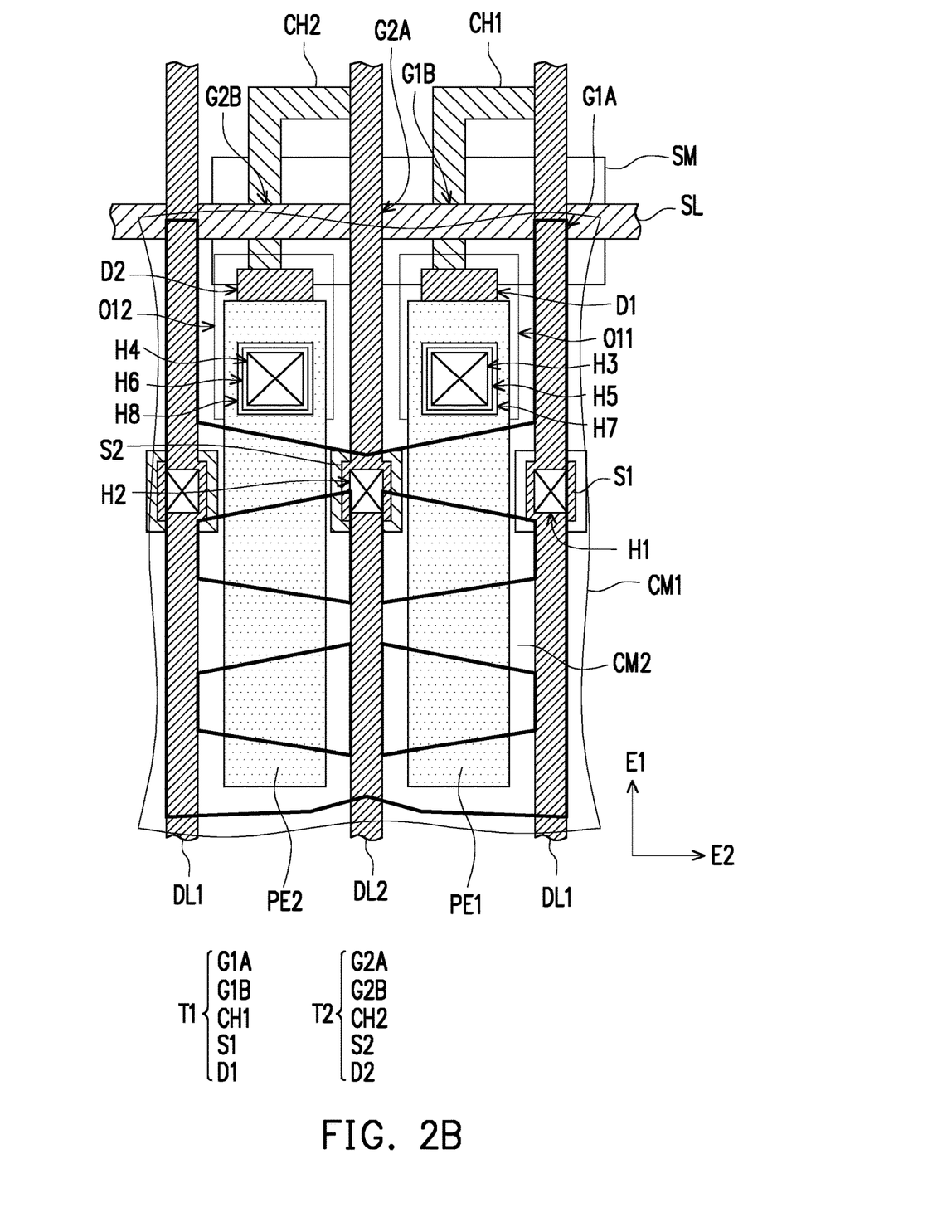
FIG. 2B is a schematic top view of the display panel of FIG. 2A with a black matrix and a plurality of color filter layers omitted.
Figure 2C:
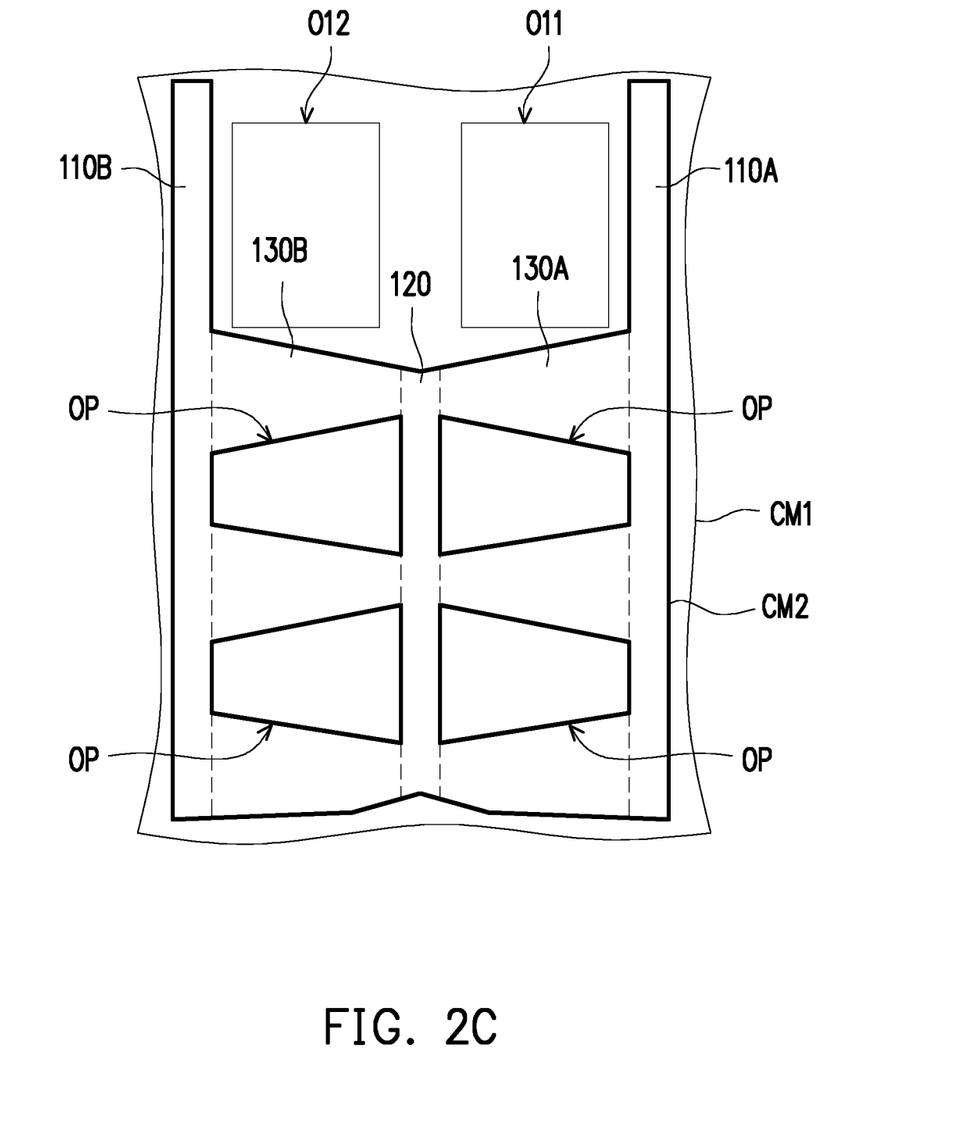
FIG. 2C is a schematic top view of a first electrode and a third electrode in FIG. 2B.
Figure 3:
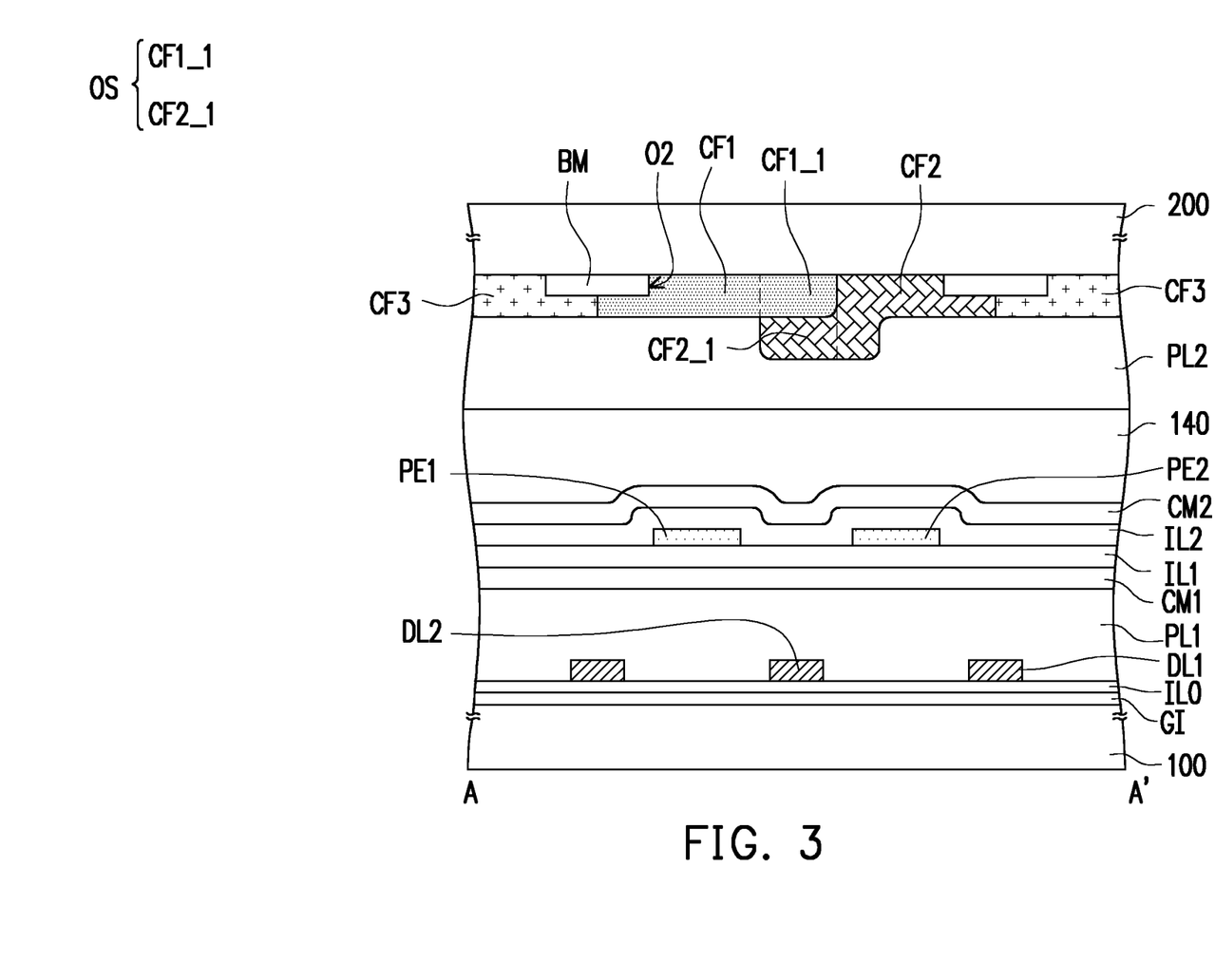
FIG. 3 is a schematic cross-sectional view taken along a cross-sectional line A-A' in FIG. 2A.

FIG. 1 is a schematic top view of a display panel according to an embodiment of the invention. FIG. 2A is an enlarged view of a region R of the display panel in FIG. 1. FIG. 2B is a schematic top view of the display panel of FIG. 2A with a black matrix and a plurality of color filter layers omitted. FIG. 2C is a schematic top view of a first electrode and a third electrode in FIG. 2B. FIG. 3 is a schematic cross-sectional view taken along a cross-sectional line A-A' in FIG. 2A.

With reference to FIG. 1, FIG. 2A, FIG. 2B, FIG. 2C, and FIG. 3 together, in this embodiment, a display panel 10 includes a scan line SL, first data lines DL1, a second data line DL2, a first switching element T1, a second switching element T2, a first electrode CM1, two second electrodes PE1 and PE2, a third electrode CM2, a black matrix BM, and a plurality of color filter layers CF1, CF2, and CF3. In addition, the display panel 10 may further includes a first substrate 100, a second substrate 200, insulation layers IL1 and IL2, planarization layers PL1 and PL2, and a display medium layer 140. For illustrative convenience, only a partial region of the display panel 10 is shown in FIG. 1. A person having ordinary skill in the art may understand a structure or a layout of the display panel 10 according to the following embodiments.

In this embodiment, the first substrate 100 and the second substrate 200 are disposed opposite to each other. The material of the first substrate 100 and the second substrate 200 may be glass, quartz, organic polymers, or other suitable materials, or a combination of at least two of the foregoing materials.

In this embodiment, the scan line SL, the first data lines DL1, the second data line DL2, the first switching element T1, the second switching element T2, the first electrode CM1, the two second electrodes PE1 and PE2, and the third electrode CM2 are disposed on the first substrate 100.

The first data lines DL1 and the second data line DL2 substantially extend in a first direction E1 and are arranged in a second direction E2, and the scan line SL substantially extends in the second direction E2. Nevertheless, the invention is not limited thereto. In some embodiments, the second direction E2 is substantially perpendicular to the first direction E1, but the invention is not limited thereto. Although the scan line SL, the first data lines DL1, and the second data line DL2 in this embodiment are exemplified as being straight lines, the invention is not limited thereto. In other embodiments, the scan line SL, the first data lines DL1, and the second data line DL2 may be shaped as a zigzag shape or other shapes. The second data line DL2 is located between two neighboring first data lines DL1. Considering electrical conductivity, the scan line SL, the first data lines DL1, and the second data line DL2 are generally made of metal, but the invention is not limited thereto. In other embodiments, the scan line SL, the first data lines DL1, and the second data line DL2 may be made of other conductive materials (e.g., alloy, metal nitride, metal oxide, metal oxynitride) or a stack layer having metal and the aforesaid conductive materials.

The first switching element T1 is electrically connected to the scan line SL and the first data line DL1. The second switching element T2 is electrically connected to the scan line SL and the second data line DL2. In this embodiment, the first switching element T1 and the second switching element T2 are exemplified as being top-gate thin film transistors, but the invention is not limited thereto. The first switching element T1 and the second switching element T2 may be bottom-gate thin film transistors or switching elements of other types in other embodiments. In this embodiment, each of the first switching element T1 and the second switching element T2 includes two gates, but the invention is not limited thereto. Each of the first switching element T1 and the second switching element T2 may include one gate only.

In this embodiment, the first switching element T1 includes a first gate G1A, a second gate G1B, a channel layer CH1, a source S1, and a drain D1. The first gate G1A and the second gate G1B are electrically connected to the scan line SL, and the source S1 is electrically connected to the first data line DLl. The second switching element T2 includes a first gate G2A, a second gate G2B, a channel layer CH2, a source S2, and a drain D2. The first gate G2A and the second gate G2B are electrically connected to the scan line SL, and the source S2 is electrically connected to the second data line DL2. The source S1 and the source S2 may electrically connected to the channel layer CH1 and the channel layer CH2 respectively through a contact hole H1 and a contact hole H2, and the drain D1 and the drain D2 may electrically connected to the channel layer CH1 and the channel layer CH2 respectively through a contact hole H3 and a contact hole H4.

The channel layer CH1 overlaps the first gate G1A and the second gate G1B. An insulation layer GI may be sandwiched between the channel layer CH1 and the first gate G1A and between the channel layer CH1 and the second gate G1B, so as to separate the channel layer CH1 from the first gate G1A and the second gate G1B. The channel layer CH2 overlaps the first gate G2A and the second gate G2B. The insulation layer GI is sandwiched between the channel layer CH2 and the first gate G2A and between the channel layer CH2 and the second gate G2B, so as to separate the channel layer CH2 from the first gate G2A and the second gate G2B. In this embodiment, the channel layer CH1 and the channel layer CH2 are exemplified as being U-shaped, but the invention is not limited thereto. The channel layer CH1 and the channel layer CH2 may be shaped as a L shape or other shapes.

In this embodiment, an insulation layer IL0 is disposed on the first gate G1A, the first gate G2A, the second gate G1B, the second gate G2B, and the insulation layer GI. In this embodiment, the first data lines DL1 and the second data line DL2 are disposed on the insulation layer IL0. In this embodiment, the contact holes H1, H2, H3, and H4 penetrate the insulation layer IL0 and the insulation layer GI.

A light-shielding layer SM may be selectively disposed between the channel layer CH1 and the first substrate 100 or between the channel layer CH2 and the first substrate 100, as shown in FIG. 2B. A current leakage problem of the first switching element T1 and the second switching element T2 may be solved through the light-shielding layer SM. In this embodiment, the material of the light-shielding layer SM may include any light-shielding material commonly known to people having ordinary skills in the art, e.g., molybdenum, molybdenum-aluminum-molybdenum, titanium-aluminum-titanium, or other metals which do not allow light to pass through or black resin, so as to shield light rays. In other embodiments, the light-shielding layer SM may selectively not to be disposed.

The planarization layer PL1 is disposed on the first substrate 100 and covers the scan line SL, the first data lines DL1, the second data line DL2, the first switching element T1, and the second switching element T2. The planarization layer PL1 includes, for example, contact holes H5 and H6. In this embodiment, the planarization layer PL1 may be made of an inorganic material (e.g., silicon oxide, silicon nitride, silicon oxynitride, or a stack layer having at least two of the above materials), an organic material (e.g., polyimide resin, epoxy resin, or acrylic resin), or a combination of both, but the invention is not limited thereto. The planarization layer PL1 may be a single-layer structure, but the invention is not limited thereto. In other embodiments, the planarization layer PL1 may be a multi-layer structure. The planarization layer PL1 provides favorable flatness to facilitate subsequent formation of the first electrode CM1.

The first electrode CM1 is disposed on the planarization layer PL1. In this embodiment, the first electrode CM1 has two first openings O11 and O12. The first opening O11, for example, overlaps the contact hole H5, and the first opening O12, for example, overlaps the contact hole H6, but the invention is not limited thereto. The material of the first electrode CM1 may include a metal oxide conductive material, such as indium tin oxide, indium zinc oxide, aluminum tin oxide, aluminum zinc oxide, indium gallium zinc oxide, other suitable oxides, or a stack layer including at least two of the above.

The insulation layer IL1 is disposed on the planarization layer PL1 and covers the first electrode CM1. The insulation layer ILL for example, includes contact holes H7 and H8. The contact hole H7, for example, overlaps the first opening O11 and the contact hole H5, and the contact hole H8, for example, overlaps the first opening O12 and the contact hole H6, but the invention is not limited thereto. The insulation layer IL1 may be made of an inorganic material (e.g., silicon oxide, silicon nitride, silicon oxynitride, or a stack layer having at least two of the above materials), an organic material (e.g., polyimide resin, epoxy resin, or acrylic resin), or a combination of both, but the invention is not limited thereto. In this embodiment, the insulation layer IL1 may be a single-layer structure, but the invention is not limited thereto. In other embodiments, the insulation layer IL1 may be a multi-layer structure.

The two second electrodes PE1 and PE2 are disposed on the insulation layer IL1. In this embodiment, the second electrode PE1 is electrically connected to the drain D1 of the first switching element T1, and the second electrode PE2 is electrically connected to the drain D2 of the second switching element T2. In this embodiment, the second electrode PE1 is electrically connected to the drain D1 through the first opening O11 and the contact holes H5 and H7 overlapped with each other, and the second electrode PE2 is electrically connected to the drain D2 through the first opening O12 and the contact holes H6 and H8 overlapped with each other. The material of the second electrodes PE1 and PE2 may include a metal oxide conductive material, such as indium tin oxide, indium zinc oxide, aluminum tin oxide, aluminum zinc oxide, indium gallium zinc oxide, other suitable oxides, or a stack layer including at least two of the above. Each of the second electrodes PE1 and PE2 may include a slit (not shown), but the invention is not limited thereto.

The insulation layer IL2 is disposed on the insulation layer IL1 and covers the second electrodes PE1 and PE2. The insulation layer IL2 may be made of an inorganic material (e.g., silicon oxide, silicon nitride, silicon oxynitride, or a stack layer having at least two of the above materials), an organic material (e.g., polyimide resin, epoxy resin, or acrylic resin), or a combination of both, but the invention is not limited thereto. In this embodiment, the insulation layer IL2 may be a single-layer structure, but the invention is not limited thereto. In other embodiments, the insulation layer IL2 may be a multi-layer structure.

The third electrode CM2 is disposed on the insulation layer IL2. In this embodiment, the third electrode CM2 includes two first body portions 110A and 110B, a second body portion 120, at least two branch portions 130A and 130B, and a plurality of opening holes OP. A portion of the first electrode CM1 overlaps the opening holes OP. In this embodiment, the opening holes OP are exemplified as being trapezoidal-shaped, but the invention is not limited thereto, and the opening holes OP may be shaped as a rectangle, a circle, or other suitable shapes.

The first body portions 110A and 110B substantially extend in the first direction E1. The first body portions 110A and 110B substantially are parallel to an extending direction of the first data line DL1. In some embodiments, the first body portion 110A entirely overlaps the first data line DL1. That is, the width of the first body portion 110A in the second direction E2 is approximately equal to the width of the first data line DL1 in the second direction E2, and the first body portion 110A and the first data line DL1 overlap in an aligned manner. Nevertheless, the invention is not limited thereto. In other embodiments, the first body portions 110A and 110B partially overlap two neighboring first data lines DL1 respectively.

The second body portion 120 is located between the first body portions 110A and 110B and substantially extends in the first direction E1. The second body portion 120 substantially is parallel to an extending direction of the second data line DL2. In some embodiments, the second body portion 120 entirely overlaps the second data line DL2. That is, the width of the second body portion 120 in the second direction E2 is approximately equal to the width of the second data line DL2 in the second direction E2, and the second body portion 120 and the second data line DL2 overlap in an aligned manner. Nevertheless, the invention is not limited thereto. In other embodiments, the second body portion 120 partially overlaps the second data line DL2.

The branch portions 130A and 130B are respectively connected to the corresponding first body portions 110A and 110B and the second body portion 120. The branch portion 130A is connected between the first body portion 110A and the second body portion 120, and the branch portion 130B is connected between the first body portion 110B and the second body portion 120. The branch portion 130A, for example, extends from the first body portion 110A towards the second body portion 120, and the branch portion 130B, for example, extends from the first body portion 110B towards the second body portion 120. In some embodiments, the width of the branch portion 130A gradually decreases in a direction away from the first body portion 110A, and the width of the branch portion 130B gradually decreases in a direction away from the first body portion 110B. In this embodiment, at least one of the branch portions 130A and 130B is trapezoidal-shaped or shaped approximately as a trapezoidal structure, which should however not be construed as being limited to the embodiment set forth herein. In other embodiments, the branch portions 130A and 130B may be shaped as a triangle or other geometric shapes.

The black matrix BM is disposed on the second substrate 200. The material of the black matrix BM is, for example, black resin, metal with low reflectivity (e.g., chromium), or other suitable materials. The black matrix BM includes a plurality of second openings O2. The second openings O2, for example, are rectangular-shaped, which should however not be construed as being limited to the embodiment set forth herein. In this embodiment, the width W1 of each of the second openings O2 in the second direction E2 is 8 microns to 15 microns, and the distance W2 between two neighboring second openings O2 in the second direction E2 is 1 micron to 6 microns, which should however not be construed as being limited to the embodiment set forth herein. In this embodiment, the second openings O2, for example, are aligned in the first direction E1 and the second direction E2 and thus are arranged along straight lines. The black matrix BM at least shields a portion of the first data line DL1 and a portion of the scan line SL substantially. In this embodiment, the black matrix BM entirely shields the first data line DL1 and the scan line SL. Each of the second openings O2 simultaneously overlap the corresponding second electrodes PE1 and PE2, as shown in FIG. 3, which should however not be construed as being limited to the embodiment set forth herein.

The color filter layers CF1, CF2, and CF3 are disposed on the second substrate 200. The color filter layers CF1, CF2, and CF3 are respectively a red filter layer, a green filter layer, and a blue filter layer, which should however not be construed as being limited to the embodiment set forth herein. In this embodiment, the color filter layers CF1 arranged in the first direction E1 have the same color, the color filter layers CF2 arranged in the first direction E1 have the same color, and the color filter layers CF3 arranged in the first direction E1 have the same color. For instance, the color filter layers CF1 are arranged in the first direction E1 to form a first column of color filter layers, the color filter layers CF2 are arranged in the first direction E1 to form a second column of color filter layers adjacent to the first column of color filter layers, and the color filter layers CF3 are arranged in the first direction E1 to form a third column of color filter layers adjacent to the second column of color filter layers. In this embodiment, two neighboring color filter layers of the color filter layers CF1, CF2, and CF3 arranged in the second direction E2 have different colors.

Two neighboring color filter layers of the color filter layers CF1, CF2, and CF3 may form an overlapped structure OS in the second opening O2. For instance, a portion of the color filter layer CF2 covers a portion of the color filter layer CF1 to form the overlapped structure OS. The overlapped structure OS includes a portion CF1_1 of the first color filter layer and a portion CF2_1 of the second color filter layer. The width W3 of the overlapped structure OS in the second direction E2 is, for example, 0.5 microns to 10 microns. In this embodiment, the width W3 of overlapped structure OS in the second direction E2 is 3 microns. In this embodiment, the overlapped structure OS may shield a portion of the second data line DL2, and in this way, the overlapped structure OS and the black matrix BM may shield the second data line DL2 together. In this embodiment, the width W3 of the overlapped structure OS in the second direction E2 and the distance W2 between two neighboring second openings O2 in the second direction E2 may be equal, but the invention is not limited thereto.

The planarization layer PL2 is disposed on the second substrate 200 and covers the black matrix BM and the color filter layers CF1, CF2, and CF3. The planarization layer PL2 may be made of an inorganic material (e.g., silicon oxide, silicon nitride, silicon oxynitride, or a stack layer having at least two of the above materials), an organic material (e.g., polyimide resin, epoxy resin, or acrylic resin), or a combination of both, but the invention is not limited thereto. In this embodiment, the planarization layer PL2 may be a single-layer structure, but the invention is not limited thereto. In other embodiments, the planarization layer PL2 may be a multi-layer structure. In other embodiments, the planarization layer PL2 may be located between the black matrix BM and the color filter layer.

The display medium layer 140 is disposed between the first substrate 100 and the second substrate 200, and the display medium layer 140 is disposed between the third electrode CM2 and the planarization layer PL2. In this embodiment, the display medium layer 140 is a liquid crystal layer, and the liquid crystal layer includes a plurality of liquid crystal molecules. The liquid crystal molecules may be positive liquid crystal molecules, negative liquid crystal molecules, or other suitable liquid crystal molecules. Nevertheless, the invention is not limited thereto. In other embodiments, the display medium layer 140 may be other non-self-luminous element (e.g., an electrophoresis element, an electrowetting element, or other suitable elements). In other embodiments, the display medium layer 140 may be a self-luminous element (e.g., a light-emitting diode or other suitable elements).

In this embodiment, as two neighboring color filter layers are correspondingly disposed in one single second opening O2 of the black matrix BM, a breakthrough regarding limitation of a minimum size of the second opening O2 can be made. In addition, a portion of the second data line DL2 exposed by the second opening O2 may be shielded by the overlapped structure OS. Besides, an electric field at the second body portion 120 of the third electrode CM2 may affect tilting of the liquid crystal molecules, and a vertical dark line may thus be generated. The vertical dark line may shield the portion of the second data line DL2 exposed by the second opening O2, and thus, a light leakage may be further prevented.

Figure 4:
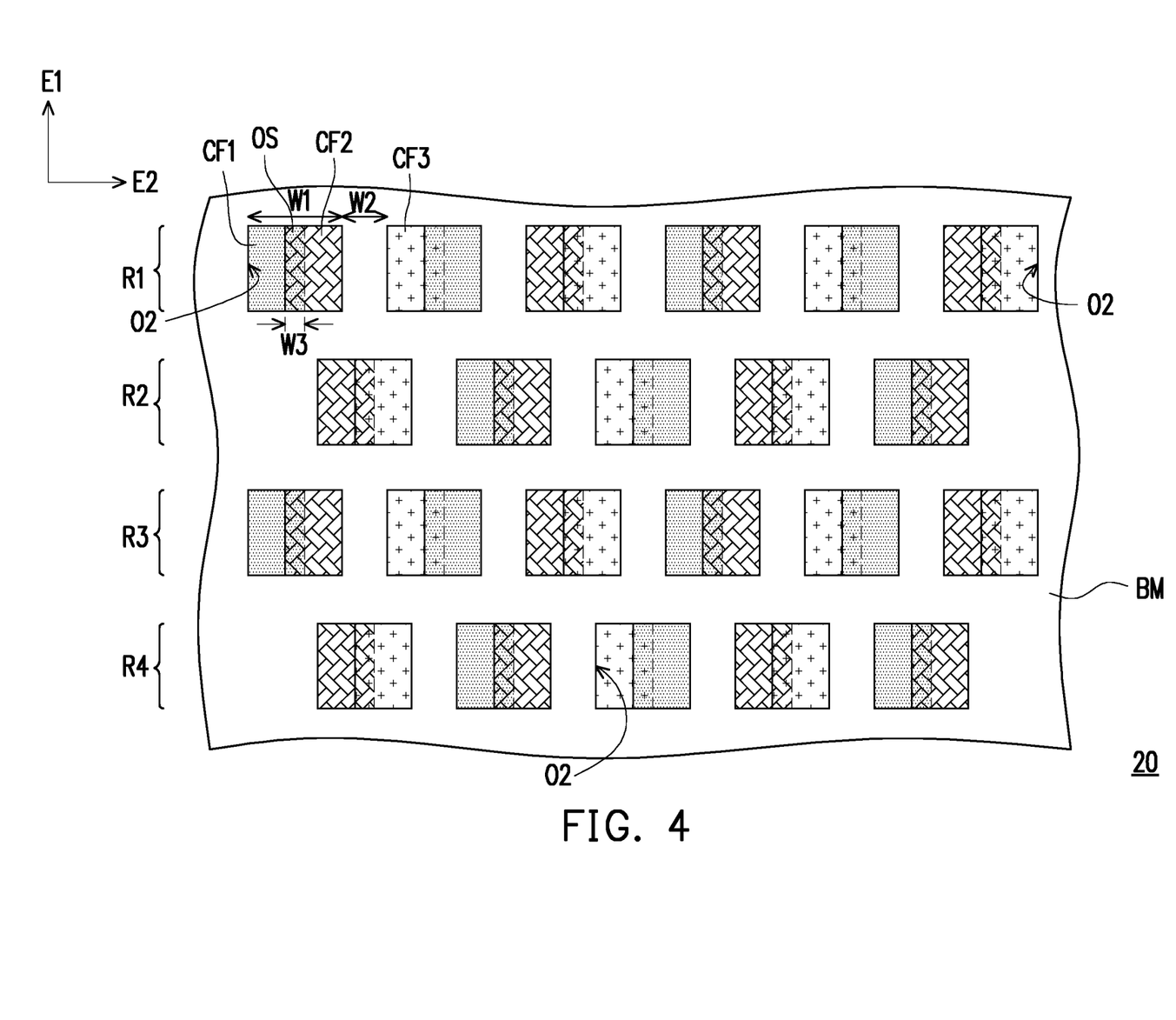
FIG. 4 is a schematic top view of a display panel according to another embodiment of the invention.

FIG. 4 is a schematic top view of a display panel according to another embodiment of the invention. It should be noted that the reference numerals and a part of the contents in FIG. 1 are also used to describe FIG. 4, in which the same reference numerals are used to represent identical or similar elements, and thus descriptions of the same technical contents are omitted. Please refer to the descriptions of the previous embodiments for the omitted contents, which will not be repeated hereinafter.

With reference to FIG. 4, a difference between a display panel 20 illustrated in FIG. 4 and the display panel 10 illustrated in FIG. 1 is that the second openings O2 of the black matrix BM are arranged in a staggered manner in the first direction E1.

In this embodiment, the second openings O2 of the black matrix BM are arranged in a staggered manner in the first direction E1. The second openings O2 at a first row R1 and the second openings O2 at a third row R3 are aligned in the first direction E1, and the second openings O2 at a second row R2 and the second openings O2 at a fourth row R4 are aligned in the first direction E1. The overlapped structures OS located at two neighboring rows in the second openings O2 are arranged in a staggered manner.

In this embodiment, corresponding to the second openings O2, a portion of the overlapped structures OS shields a portion of the first data line DL1, and another portion of the overlapped structures OS shields a portion of the second data line DL2. The overlapped structures OS and the black matrix BM may shield the scan line SL, the first data line DL1, and the second data line DL2 together.

In this embodiment, given that the second openings O2 of the black matrix BM are arranged in a staggered manner in the first direction E1, color dot shifts generated by the overlapped structure OS or vertical traces generated by non-uniformity of images in display may be reduced. For instance, when the display panel 20 is adopted to display images, the overlapped structures OS located at two neighboring rows (e.g., the first row R1 and the second row R2) in the second openings O2 are not located on the same straight line. Hence, uneven brightness distribution of vertical images generated by the overlapped structures OS may be improved, and that the uniformity of images in display of the display panel 20 is enhanced.

In view of the foregoing, in at least one embodiment of the invention, two color filter layers are designed to be disposed in one second opening of the black matrix, and thereby a breakthrough regarding the limitation of the minimum size of the second openings can be made, size of pixels is reduced and a higher resolution is provided. In addition, a portion of the second data line which is not covered by the black matrix is shielded by the overlapped structure formed by two neighboring color filter layers and the second body portion of the third electrode together, and thereby a light leakage is further prevented.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display panel, comprising:
    a scan line, a first data line, and a second data line, wherein the first data line and the second data line are substantially extending in a first direction, and the scan line is substantially extending in a second direction;
    a first switching element, electrically connected to the scan line and the first data line;
    a second switching element, electrically connected to the second data line;
    a first electrode, comprising at least two first openings;
    two second electrodes, electrically connected to the first switching element and the second switching element respectively through the at least two first openings;
    a third electrode, comprising:
    two first body portions, substantially extending in the first direction;
    a second body portion, located between the two first body portions and substantially extending in the first direction; and
    at least two branch portions, respectively connected to the second body portion and one of the two first body portions;
    a black matrix, comprising a plurality of second openings, wherein the black matrix substantially shields at least a portion of the first data line; and
    a plurality of color filter layers, wherein two neighboring color filter layers form an overlapped structure corresponding to one of the second openings, and the overlapped structure substantially shields at least a portion of the second data line.

2. The display panel as claimed in claim 1, wherein the second openings are arranged along a straight line in the first direction.

3. The display panel as claimed in claim 1, wherein the second openings are arranged in a staggered manner in the first direction.

4. The display panel as claimed in claim 3, wherein one of the second openings overlaps the two second electrodes.

5. The display panel as claimed in claim 1, wherein one of the second openings overlaps the two second electrodes.

6. The display panel as claimed in claim 1, wherein the overlapped structure entirely shields the second data line in the one of the second openings.

7. The display panel as claimed in claim 1, wherein the at least two first openings respectively expose at least one portion of the first switching element and at least one portion of the second switching element in a projection direction, the second body portion overlaps the second data line, the color filter layers arranged in the first direction have the same color, and two neighboring color filter layers arranged in the second direction have different colors.

8. The display panel as claimed in claim 1, wherein a width of each of the at least two branch portions in the first direction gradually decreases in a direction away from the first body portion.

9. The display panel as claimed in claim 8, wherein each of the at least two branch portions is shaped as a trapezoidal structure.

10. The display panel as claimed in claim 8, wherein each of the at least two branch portions is shaped approximately as a trapezoidal structure.

11. The display panel as claimed in claim 1, wherein a width of each of the second openings in the second direction is 8 microns to 15 microns, and a distance between two neighboring second openings in the second direction is 1 micron to 6 microns.

12. A display panel, comprising:
    a scan line, a first data line, and a second data line, wherein the first data line and the second data line are substantially extending in a first direction, and the scan line is substantially extending in a second direction;
    a first switching element, electrically connected to the scan line and the first data line;
    a second switching element, electrically connected to the second data line;
    a first electrode, comprising at least two first openings;
    two second electrodes, electrically connected to the first switching element and the second switching element respectively through the at least two first openings;
    a third electrode, comprising:
    two first body portions, substantially extending in the first direction;
    a second body portion, located between the two first body portions and substantially extending in the first direction; and
    at least two branch portions, respectively connected to the second body portion and one of the two first body portions; and
    a black matrix, comprising a plurality of second openings, wherein the black matrix shields at least a portion of the first data line, and one of the second openings overlaps the two second electrodes.

13. The display panel as claimed in claim 12, wherein the second openings are arranged along a straight line in the first direction.

14. The display panel as claimed in claim 12, wherein the second openings are arranged in a staggered manner in the first direction.

15. The display panel as claimed in claim 12, wherein the second body portion overlaps the second data line, the color filter layers arranged in the first direction have the same color, and two neighboring color filter layers arranged in the second direction have different colors.

16. The display panel as claimed in claim 12, wherein a width of each of the second openings in the second direction is 8 microns to 15 microns, and a distance between two neighboring second openings in the second direction is 1 micron to 6 microns.

17. The display panel as claimed in claim 12, further comprising a liquid crystal layer located between the black matrix and the third electrode.

* * * * *